United States Patent
Wang et al.

(10) Patent No.: US 6,740,586 B1
(45) Date of Patent: May 25, 2004

(54) VAPOR DELIVERY SYSTEM FOR SOLID PRECURSORS AND METHOD OF USING SAME

(75) Inventors: Luping Wang, Brookfield, CT (US); Thomas H. Baum, New Fairfield, CT (US); Chongying Xu, New Milford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 12 days.

(21) Appl. No.: 10/288,743

(22) Filed: Nov. 6, 2002

(51) Int. Cl.⁷ .................. H01L 21/31; H01L 21/469
(52) U.S. Cl. .............. 438/680; 438/681; 438/785; 118/715; 118/729; 392/388
(58) Field of Search .................. 438/680, 681, 438/758, 785; 427/585, 124; 392/388, 397; 118/715, 728, 729

(56) References Cited

U.S. PATENT DOCUMENTS

| | | | |
|---|---|---|---|
| 5,453,494 A | 9/1995 | Kirlin et al. | |
| 5,679,815 A | 10/1997 | Kirlin et al. | |
| 5,741,544 A * | 4/1998 | Mahulikar | 427/236 |
| 5,859,274 A | 1/1999 | Baum et al. | |
| 6,043,563 A * | 3/2000 | Eldridge et al. | 257/784 |
| 6,204,402 B1 | 3/2001 | Baum et al. | |
| 6,299,692 B1 * | 10/2001 | Ku et al. | 118/726 |
| 6,365,016 B1 * | 4/2002 | Iacovangelo et al. | 204/192.38 |
| 6,399,208 B1 | 6/2002 | Baum et al. | |
| 6,470,144 B1 * | 10/2002 | Tarutani et al. | 392/396 |
| 2002/0091268 A1 * | 7/2002 | Xu et al. | 548/101 |
| 2003/0053799 A1 * | 3/2003 | Lei | 392/388 |
| 2003/0234176 A1 * | 12/2003 | Haidar | 204/192.38 |

OTHER PUBLICATIONS

U.S. patent application Ser. No. 10/201,518, John Gregg, et al., filed Jul. 23, 2002.

* cited by examiner

Primary Examiner—Alexander Ghyka
(74) Attorney, Agent, or Firm—Margaret Chappuis; Steven J. Hultquist; William F. Ryann (57) ABSTRACT

A vaporizer delivery system including a sublimatable solid precursor material applied to a wire substrate for vaporizing and achieving a continuous uninterrupted delivery of a vaporized precursor to a downstream semiconductor process chamber. The coated wire substrate is drawn past a heat source at a predetermined speed to rapidly heat and vaporize the sublimatable solid precursor.

49 Claims, 6 Drawing Sheets

VAPOR DELIVERY SYSTEM FOR SOLID PRECURSORS AND METHOD OF USING SAME

BACKGROUND OF THE INVENTION

1. Field of the Invention

The present invention relates to a vaporizer, and more particularly, to a vaporizer delivery system comprising a sublimatable solid precursor material applied to a wire substrate for vaporizing and achieving a continuous uninterrupted delivery of a vaporized precursor to a downstream semiconductor process chamber.

2. Description of the Related Art

Chemical vapor deposition (CVD) has been extensively used for preparation of films and coatings in semiconductor wafer processing. CVD is a favored deposition process in many respects, for example, because of its ability to provide highly conformable and high quality films, at relatively fast processing times. Further, CVD is beneficial in coating substrates of irregular shapes including the provision of highly conformable films even with respect to deep contacts and other openings.

In general, CVD techniques involve the delivery of gaseous reactants to the surface of a substrate where chemical reactions takes place under temperature and pressure conditions that are favorable to the thermodynamics of the desired reaction. The type and composition of the layers that can be formed using CVD is limited by the ability to deliver the reactants or reactant precursors to the surface of the substrate. Various liquid reactants and precursors are successfully used in CVD applications by delivering the liquid reactants in a carrier gas. In liquid reactant CVD systems, the carrier gas is typically bubbled at a controlled rate through a container of the liquid reactant so as to saturate the carrier gas with liquid reactant, and the saturated carrier then is transported to the reaction chamber.

Analogous attempts have been made to deliver solid reactants to a CVD deposition chamber, but with much less success. The delivery of solid precursors in CVD processing is carried out using the sublimator/bubbler method in which the precursor typically is placed in a sublimator/bubbler reservoir, which then is heated to the sublimation temperature of the precursor to transform it into a vapor for transport into the CVD reactor with a carrier gas such as argon, or nitrogen. The carrier gas mixes with the vapor, and is then transported to the deposition chamber.

However, this procedure has been unsuccessful in reliably and reproducibly delivering a solid precursor to the reaction chamber for a number of reasons. Initially, it is difficult to ensure complete saturation of the fast flowing carrier gas stream because of the limited amount of exposed surface area of the solid precursor in the vaporizer system and need for uniform temperature to provide maximum sublimation. This problem may be alleviated by using large excesses of precursor material beyond the amount needed for film growth. However, using an excess of material can result in a substantial waste of precursor materials.

Further, it is difficult to vaporize a solid at a controlled rate such that a reproducible flow of vaporized solid precursor can be delivered to the process chamber. Lack of control of solid precursor sublimation is, at least in part, due to the changing surface area of the bulk solid precursor as it is vaporized. Such a changing surface area when the bulk solid precursor is exposed to sublimation temperatures produces a continuously changing rate of vaporization, particularly for thermally sensitive compounds. This ever-changing rate of vaporization results in a continuously changing and non-reproducible flow of vaporized solid precursor for deposition in the process chamber. As a result, processes using such vaporized solid precursors cannot be controlled adequately and effectively.

Accordingly, there is a need in the art for a vapor delivery system for delivering solid precursors, particularly thermally sensitive precursors, which efficiently vaporizes solid precursor materials at a highly controllable and reproducible flow rate.

SUMMARY OF THE INVENTION

The present invention relates to a vaporizer system and method for vaporizing solid precursor source materials having particular utility for semiconductor manufacturing applications.

In one aspect, the present invention relates to a vapor delivery system for vaporization and delivery of a solid source material that provides sufficient surface area of the solid source material to meet the flow rates required for typical deposition applications.

Accordingly, the present invention provides for a system for delivering a precursor vapor, said system comprising:
 a. a solid precursor vaporization chamber;
 b. an elongate support having a vaporizable solid precursor coated thereon:
 c. means for
  i) translating the elongate support having the vaporizable solid precursor coated thereon through the chamber so that a length of the elongate support having the vaporizable solid precursor coated thereon is exposed for vaporization of said vaporizable solid precursor in said chamber, and
  ii) translating out of the chamber the elongate support from which the solid precursor has been vaporized;
 d. means for heating the exposed length of the elongate support having the vaporizable solid precursor coated thereon in said chamber; and
 e. means for discharging precursor vapor from said chamber.

In the present invention the elongated support may include, but is not limited to, screens, meshes, webs, wires, fibers, multifilament ropes, chain structures, and ribbons. The support may further comprises an electrically resistively heatable element that can be electrically heated to a temperature for vaporizing said solid precursor coated on the elongate support. Preferably, the elongated support is a wire element connected to a dispensing spool arranged for continuous feed of the wire element through the internal chamber. Further, the solid precursor depleted wire element can be rewound on an uptake spool positioned adjacent to the chamber.

In another aspect, the present invention relates to a vapor delivery system for vaporization and delivery of a precursor, comprising:
 a. a sealable housing comprising an internal chamber;
 b. a gas inlet port in fluid communication with the internal chamber for introducing a carrier gas;
 c. a first rotatable spool positioned adjacent to the housing;
 d. a wire coated with a sublimatable solid precursor material having one end connected to first rotatable spool and spooled thereon;

e. a heating means communicatively connected to the internal chamber to heat at least a portion of the internal chamber thereby providing a heated area at the sublimation temperature of the sublimatable solid precursor material;

f. at least one drive mechanism for unspooling and moving the coated wire through the heated area wherein the sublimatable solid precursor material is vaporized forming a precursor gas and a substantially uncoated wire; and g. a gas outlet port for passage of the precursor gas from the internal chamber to a downstream processing unit.

The delivery system may further comprise a second rotatable spool for spooling of the uncoated wire, wherein the second rotatable spool can be connected to the drive mechanism and positioned a distance from the first rotatable spool and adjacent to the housing.

Solid precursors useful in the present invention include but are not limited to, elemental boron, copper and phosphorus; decaborane; metal halides such as gallium halides, indium halides, antimony halides, arsenic halides, gallium halides, aluminum iodide, titanium iodide; metalorganic complexes, such as, cyclopentadienylcycloheptatrienyltitanium ($C_p$TiCht), cyclooctatetraenecyclopentadienyltitanium, biscyclopentadienyltitanium-diazide, $In(CH_3)_2(hfac)$, dibromomethyl stibine and tungsten carbonyl, as well as metalorganic β-diketonate complexes, metalorganic alkoxide complexes, metalorganic carboxylate complexes, metalorganic aryl complexes and metalorganic amido complexes.

Other solid precursor compositions useful in specific applications of the instant invention are disclosed in the following United States Patents, which are commonly owned by the assignee of the present application and hereby incorporated herein by reference in their entireties:

U.S. patent application Ser. No. 09/414,133 in the names of, Thomas H. Baum and Witold Paw, which was issued as U.S. Pat. No. 6,399,208 on Jun. 4, 2002;

U.S. patent application Ser. No. 09/218,992 filed 22 Dec. 1998, in the names of, Chongying Xu and Thomas H. Baum, which was issued as U.S. Pat. No. 6,204,402 on Mar. 20, 2001;

U.S. patent application Ser. No. 08/960,915 filed 30 Oct. 1997, in the names of, Thomas H. Baum, et al., which was issued as U.S. Pat. No. 5,859,274 on Jan. 12, 1999.

U.S. patent application Ser. No. 08/307,316 filed 16 Sep. 1994 in the names of Peter S. Kirlin et al., which was issued as U.S. Pat. No. 5,679,815 on Oct. 21, 1997; and U.S. application Ser. No. 07/918,141 filed Jul. 22, 1992 in the names of Peter S. Kirlin, et al., and issued as U.S. Pat. No. 5,453,494;

In yet another aspect, the present invention relates to a vaporizer delivery system, comprising:

a. a sealable housing comprising an internal chamber;

b. a gas inlet and gas outlet in fluid communication with the internal chamber, c. at least one rotatable spool positioned within the internal chamber for holding a wire coated with a sublimatable solid source material;

d. a heating means communicatively connected to at least a portion of the housing to provide a heated area within the internal chamber at the sublimation temperature of the solid source material;

e. a drive mechanism for moving the coated wire from the rotatable spool through the heated area.

In still a further aspect, the present invention provides for a vaporizer system comprising:

a. a sealable vessel comprising an internal chamber;

b. a gas inlet and gas outlet in fluid communication with the internal chamber;

c. a conductive wire coated with a sublimatable solid source material for introduction into the internal chamber, wherein the conductive wire has a length extending beyond the longitudinal axis of the sealable vessel;

d. at least one motorized mechanism positioned adjacent to the sealable vessel for moving the conductive wire through the internal chamber;

e. a heating means for raising the temperature in the internal chamber to the sublimation temperature of the sublimatable solid source material; and f. a pair of electrodes positioned in the internal chamber and contacting the conductive wire for passing an electric heating current therethrough.

In yet another aspect, the present invention provides a method for vaporizing and delivering a solid source material to a downstream semiconductor process chamber, comprising:

a. providing a metallic substrate coated with a sublimatable solid precursor material;

b. introducing the coated substrate into a housing having an internal chamber;

c. heating the internal chamber to the sublimation temperature of the sublimatable solid precursor material to form a precursor gas; and d. moving the coated substrate through the internal chamber wherein the sublimatable solid material coated on the metallic substrate is sublimated to form a precursor gas and an uncoated metallic substrate; and e. removing the precursor gas from the internal chamber and transporting same to the downstream semiconductor process chamber.

This embodiment further contemplates the step of passing an electric heating current through the coated wire that has a core wire fabricated of an electrically conductive core and coated with a sublimatable solid precursor material.

Other aspects and features of the invention will be more fully apparent from the ensuing disclosure and appended claims.

DETAILED DESCRIPTION OF THE INVENTION AND PREFERRED EMBODIMENTS THEREOF

Generally, the vapor delivery system described herein utilizes a sublimatable solid precursor material applied to a metallic substrate, such as a wire. The coated substrate is drawn through a heated internal chamber at a predetermined speed to rapidly heat and vaporize the sublimatable solid precursor. The vaporization continues until the desired amount of solid precursor is vaporized. The vapor delivery system of the present invention vaporizes a known amount of precursor and achieves continuous uninterrupted delivery of the vaporized solid precursor to a downstream process chamber in reproducible fashion. Further, the present invention allows the user to vaporize sufficient quantities of a solid precursor material to meet the flow rates required for typical deposition applications.

Figure 1:
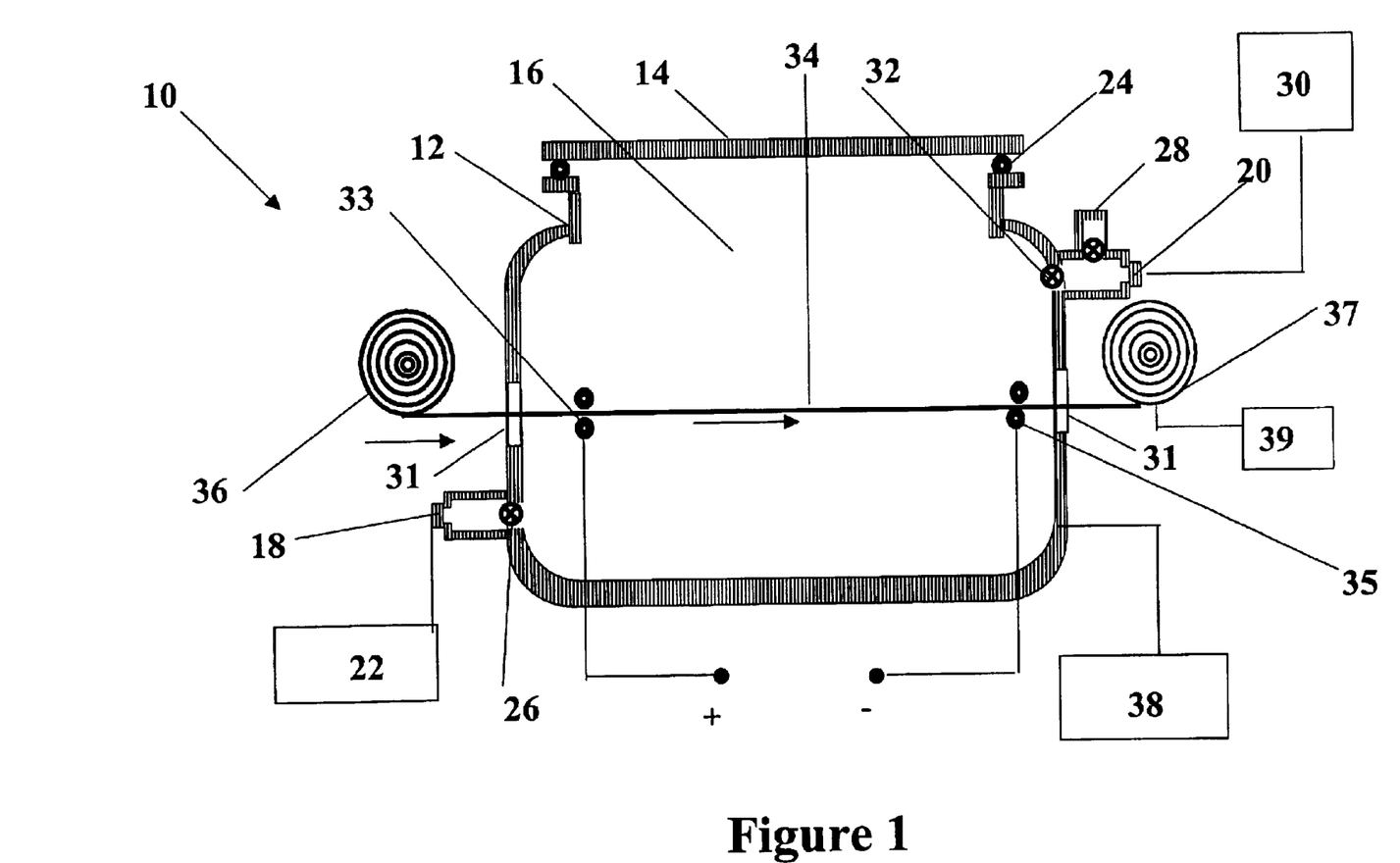
FIG. 1 is a schematic diagram of a sublimation system in accordance with the present invention for subliming a solid precursor from a coated metallic substrate coiled on a rotatable spool for drawing through the sublimation system.

One embodiment of the present invention is a vapor delivery system described with reference to FIG. 1. The vaporizer delivery system 10 comprises a housing 12, a sealable cover plate 14 that is removably attached to the housing to form a sealed internal chamber 16. A gasket 24 seals the connection between the housing 12 and the cover plate 14. The housing may be fabricated of a suitable heat-conducting material, such as for example silver, silver alloys, copper, copper alloys, aluminum, aluminum alloys, lead, nickel clad, stainless steel, graphite and/or ceramic materials.

The housing includes a gas inlet port 18 and gas outlet port 20 in fluid communication with the internal chamber. The gas inlet port 18 is in fluid communication with a carrier gas supply 22. A suitably valved manifold 26 may be connected to the inlet port for controlling the flow rate and pressure of the carrier gas into the internal chamber. The carrier gas may be an inert gas such as argon, helium, nitrogen, neon, and etc.

The gas outlet port 20 is in fluid communication with the internal chamber 16 and a semiconductor processing chamber 30. The outlet port receives the precursor gas formed within the internal chamber. It should be recognized that this embodiment can be maintained under a vaccum to increase vaporization of the solid material. A vacuum may be generated with the internal chamber by either connection with the semiconductor processing chamber 30 or outlet port 28 which may be connected to a separate vacuum source (e.g. a turbo pump). Generally, the vacuum may be maintained from about 100 torr to about $1 \times 10^{-11}$ torr. Advantageously, this embodiment limits vaporization of a solid precursor to only that within the internal chamber. A suitably valved manifold 32 can control gas flow of the precursor gas through the outlet port 20.

Figure 2:
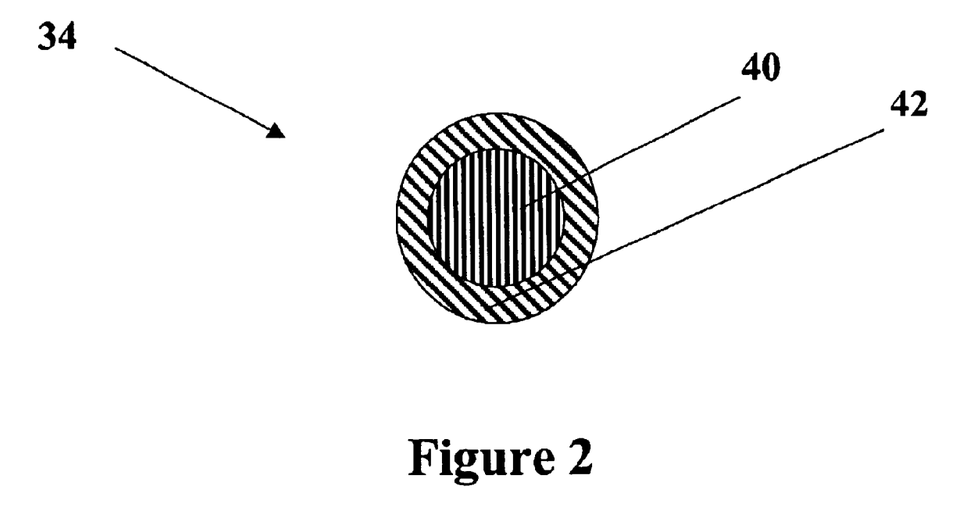
FIG. 2 is a cross-sectional view of a metallic substrate coated with a sublimatable solid precursor material.

Traversing the internal chamber 16 is a length of coated wire 34 having deposited thereon a sublimatable solid precursor material. The coated wire is initially wound around a first rotatable spool 36. The windings of the coated wire are unwound and moved through the internal chamber during the vaporization process. As shown in FIG. 2, the coated wire comprises a core wire 40 and an outer coating of a sublimatable solid precursor 42. Preferably the core wire is fabricated of a material that has a melting temperature higher than the sublimation temperature of the sublimatable solid precursor coated thereon. The wire may take on any geometry, including but not limited to, circular, ovoid, ellipsoidal, rectangular, square and polygonal cross-section. The wire core material may include, but is not limited to, silver, silver alloys, copper, copper alloys, aluminum, aluminum alloys, lead, nickel clad, stainless steel, nickel alloys, graphite and/or ceramic material. In the preferred embodiment of wire 34, the wire core 40 is a metallic substrate having a diameter of approximately fifty (50) to one hundred fifty (150) microns. Preferably the core wire is fabricated from an electrically conductive metal to provide the option of heating both the interior surface of the sublimatable solid precursor that contacts the core wire and the exterior surface of the sublimatable solid precursor exposed to the heated internal chamber.

The sublimatable solid precursor layer 42 is fabricated from any solid precursor applicable for use in a semiconductor process system, including but not limited to, elemental boron, copper and phosphorus; decaborane; metal halides such as gallium halides, indium halides, antimony halides, arsenic halides, gallium halides, aluminum iodide, titanium iodide; metalorganic complexes, such as, cyclopentadienyl-cycloheptatrienyltitanium ($C_pTiCht$), cyclooctatetraenecyclopentadienyltitanium, biscyclopentadienyltitanium-diazide, $In(CH_3)_2$(hfac), dibromomethyl stibine and tungsten carbonyl, as well as metalorganic β-diketonate complexes, metalorganic alkoxide complexes, metalorganic carboxylate complexes, metalorganic aryl complexes and metalorganic amido complexes. Preferably, this coating has a width of approximately fifty (50) to one hundred fifty (150) microns.

The solid precursor material is coated on the surface of the core wire by any of various methods including the method of melting the solid precursor material by heating, applying to the support wire core and then cooling it. Additionally, the solid precursor material may be dissolved in a solvent to form a solution, applying the solution to the surface of the core wire and then removing the solvent under reduced pressure. Alternatively, the wire can be coated by sublimation of the solid precursor material and then condensation of the solid precursor material on the surface of the core wire. Each of the above processes for preparing the coated wires may be repeated several times to achieve additional thickness. The desired thickness may be utilized in controlling the delivery rate of the vaporized solid precursor material to the process chamber.

The first rotatable spool 36 is removably mounted adjacent to the housing 12. Spool 36 can be replaced when additional material is required. Wire 34 is wound on spool 36 in a juxtaposed spooled configuration forming a plurality of overlapping coils. Preferably, the winding of the wire on the spool is completed before positioning the spool in working relation to the housing. Notably, a relatively long length of wire 34 can be positioned on the spool. Spool 36 can be made of any suitable material, e.g., steel, aluminum or any material that can withstand the elevated temperatures that may occur during the vaporization process.

As the spool is rotated, successive portions of the wire are drawn sequentially through the internal chamber and then wound around a second rotatable spool 37. To draw or feed the wire through the internal chamber, a free end of the wire is attached to the second rotatable spool and at least the second rotatable spool is rotated by a drive mechanism 39. The drive mechanism rotates a shaft that the rotatable spool attaches thereto. The shaft is rotated at a predetermined speed to move the second rotatable spool at a rate that winds the depleted wire onto the spool and draws the wire through the internal chamber wherein the sublimatable solid precursor material is vaporized to form a precursor gas. As the sequential lengths of coated wire are moved along the longitudinal axis of the internal chamber a heating unit 38 vaporizes a predetermined amount of solid precursor. The rate of the vaporization and delivery of vaporized precursor gas to the process chamber can be controlled by the speed of the rotating spool. Further, as previously indicated, the thickness of the solid precursor material on the core wire can also be varied to change the flow rate. The uniformity of the solid precursor material on the core wire provides for reproducibility of the process.

Housing 12 is heated to the desired sublimation temperature by the heating means 38. The heating means can include any suitable device which provides sufficient heat to cause the sublimatable solid precursor to vaporize including, without limitation, strip heaters; radiant heaters; circulating fluid heaters; resistant heating systems; electromagnetic energy systems including frequencies in the ranges of infrared, ultrasound, acoustic, ultraviolet and etc.; inductive heating systems; etc., constructed and arranged for controlled temperature operation. Preferably, the heating means heats a heating area without the heating means directly contacting with the coated substrate. The temperature of the vaporizer is different dependent on the operating conditions of the downstream semiconductor processing system, the vapor pressure, type and amount of the source material. The temperature is generally from about 250 to about 2000° C., and more preferably from about 400 to 1200° C.

The present invention has been designed to sustain a sublimation-direct transition from the solid state to the vapor state. At a given temperature, the vapor pressure of a solid is the partial pressure of that material at the interface, that is, there are as many molecules condensing on the solid surface as the number of molecules sublimating from the surface at a given time period. Equilibrium is destroyed if the molecules in gaseous state is removed from the solid/gas interface by the carrier gas. Clearly, sublimation takes place at a higher rate to restore equilibrium if there is enough heat supplied to the surface of the solid to make up for the latent heat of sublimation.

To enhance the sublimation process the present invention contemplates a second heating source that provides heating of the solid source material by contacting the core wire with a heating current that traverses the core wire. As can shown in FIG. 1, the coated wire is guided by several feed rollers 33 and 35 that can function as a pair of electrodes if the feed rollers are fabricated of an electrically conductive material. Thus an electric heating current can be used to heat a conductive core wire coated with a solid precursor material. As current is introduced to the core wire, the interface between the core wire and the solid precursor material is heated thereby enhancing the vaporization of the solid precursor material from within the coating. A source of direct current has one of its positive terminal connected to feed roller 33 and the current passes longitudinally through the core wire into feed roller 35 which is connected to the negative terminal. The heating current can vary between 115 and 200 amps depending on the speed of the moving wire and coating thickness of the solid precursor material. This current flow causes the core wire to heat thereby providing an increased and reproducible sublimation rate of the solid precursor. It should be recognized that even though a direct current source has been illustrated the inventors also contemplate utilizing alternating current to cause heating of the solid precursor surface contacting the conductive metallic substrate.

The apparatus of the present invention further comprises lines for supplying a carrier gas and for transferring a vaporized gas, which are connected to the vaporizer, valves, adjusting valves and instruments for measurements of pressure and temperature. The apparatus further comprises heaters for maintaining the temperature in the lines for supplying a carrier gas and for transferring a vaporized gas from the apparatus for vaporizing and transferring a material to a downstream semiconductor processing system.

In operation of the vaporizer delivery system 10, a first rotatable spool 36 holding a coil of wire coated with a sublimatable solid precursor is attached to a rotatable shaft. A free end of the coated wire is fed through an air lock 31 in housing 12, through the internal chamber and through another air lock 31 for attachment to a second rotatable spool 37 that is aligned with the first rotatable spool to reduced twisting of the moving wire. At the start of the process, a vacuum is generated within the internal chamber. At this time there is no carrier gas flowing through the internal chamber. The entire system including the internal chamber 16 and coated wire 34 are heated by a heating means. After an initial heating period, the solid precursor material is vaporized. A carrier gas is introduced into the internal chamber via gas inlet port 18 for carrying the vaporized precursor material through the outlet port 20 to a downstream processing chamber that requires a flow of the precursor gas.

After a time, the precursor material will begin to be completely sublimed off the core wire and at this time a drive mechanism 39 is activated so that an additional length of coated wire is unwound from the first rotatable spool while the depleted wire is wound on the second rotatable spool. Movement of the coated wire through the internal chamber will continuously expose new precursor material to the carrier gas and in this manner precursor material can be continuously supplied to the downstream processing chamber. The subliming surface area, however, will remain constant, resulting in a constant net material sublimation rate.

Referring again to FIG. 1, as the coated wired moves through the internal chamber, the portion of the coated wire exposed to the heating section is rapidly vaporized. The vapors are carried through the internal chamber by the carrier gas through the gas outlet port to the downstream processing system. The velocity of the moving wire is generally in the range of about 0.05 to about 10 mm per minute. The carrier gas flow rate is sufficient to provide the required vaporized precursor gas to the downstream processing unit and preferably from about 100 to about 1000 cm$^3$/min depending on the requirements of the processing system. By way of example, the internal chamber can be heated to a temperature of from about 250 to about 2000° C., at a vacuum of from 0.01 mTorr to 10 mTorr, to provide a precursor gas flow rate of from 1 sccm to 500 sccm.

Figure 3:
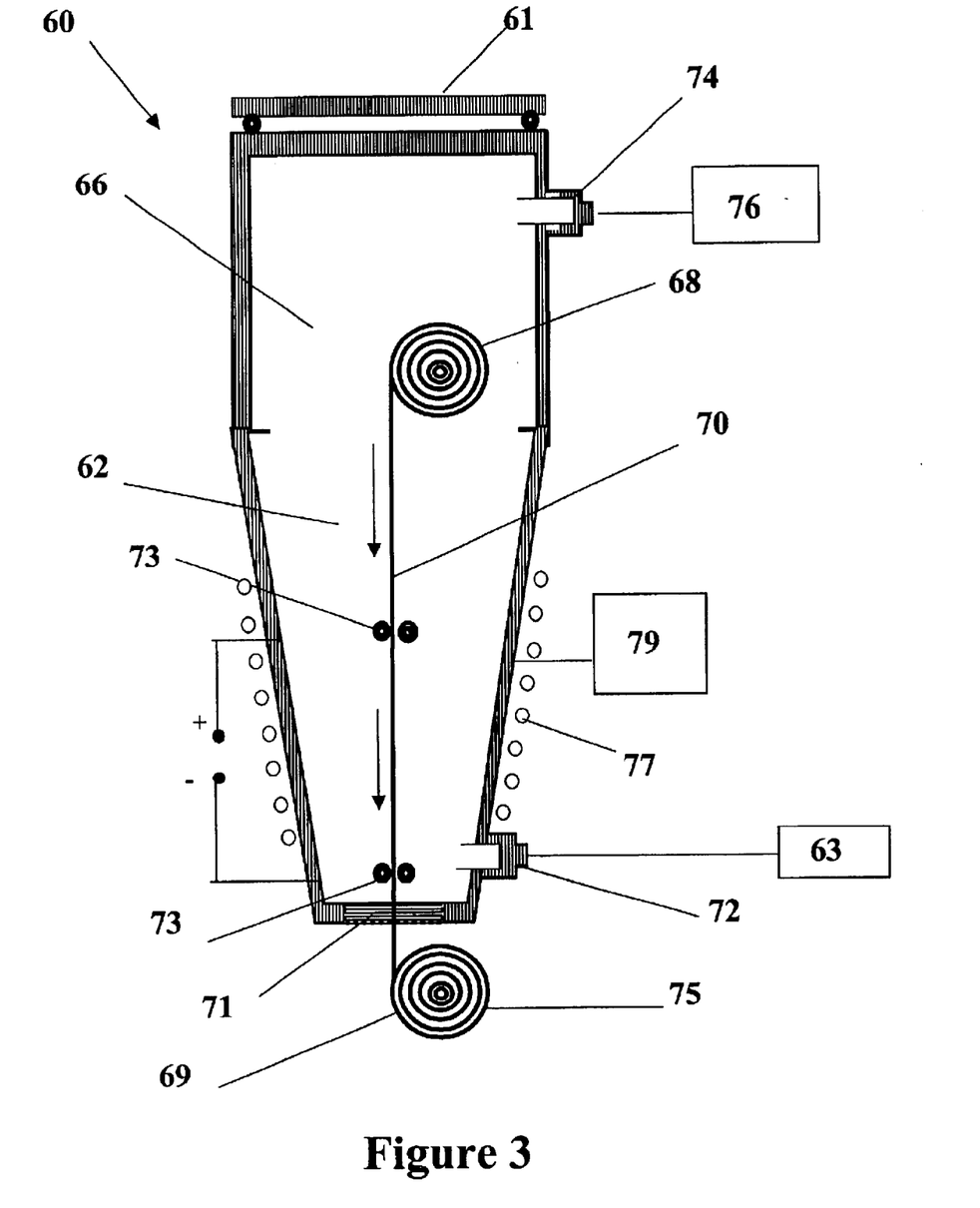
FIG. 3 is a schematic diagram of a sublimation system illustrating a sublimator having a cone-shaped configuration enclosing a rotatable spool having a coiled length of substrate coated with a sublimatable solid precursor in accordance with one embodiment of the present invention.

In an alternate embodiment of the invention, the housing has a configuration such as shown in FIG. 3. Housing 60, preferably fabricated of a conductive material as described herein above, comprises a sealable cover 61, a heating area 62 and a preheating area 66. A gas inlet port 72 is provided to provide input of a carrier gas from a carrier gas source 63. This embodiment provides for a more concentrated heating area 62 while permitting a preheating section 66 within the internal chamber for positioning a rotatable spool 68. Placement of the rotatable spool within the internal chamber provides for preheating of the sublimatable solid precursor coated on a wire that is wound on the rotatable spool. Preferably, the rotatable spool is constructed from a material capable of withstanding high temperatures, such as stainless steel or material described hereinabove relating to fabrication of the housing. A drive mechanism 75 draws the coated wire 70 from the rotatable spool and through the heating area 62, guided by guide rollers 73, wherein the sublimatable solid precursor is vaporized forming a precursor gas and a depleted core wire. The depleted core wire can be drawn through air lock 71 and respooled on rotatable spool 69. The vaporized precursor gas is removed from the internal chamber via gas outlet port 74 for passage to a downstream processing chamber 76. Heat can be supplied to the heating area by a variety of means as described hereinabove.

Preferably, the heating means includes an inductive coil 77 for heating the heating area 62 of the internal chamber. The heating coil is operated by the rf power supply 79. The power supply may be controlled by feedback from a thermocouple positioned within the internal chamber (not shown) that is connected to suitable controls to maintain the heating area at a controlled temperature. The amount of power required for complete sublimation of the solid precursor is a function of the chemistry of the solid precursor material, carrier gas, and the flow rate of the vaporized precursor gas and carrier gas all within the knowledge of one skilled in the art.

It should be recognized that this embodiment may further comprise a secondary heating source comprising a pair of electrodes for directing an electrically heating current through the coated substrate.

Figure 4:
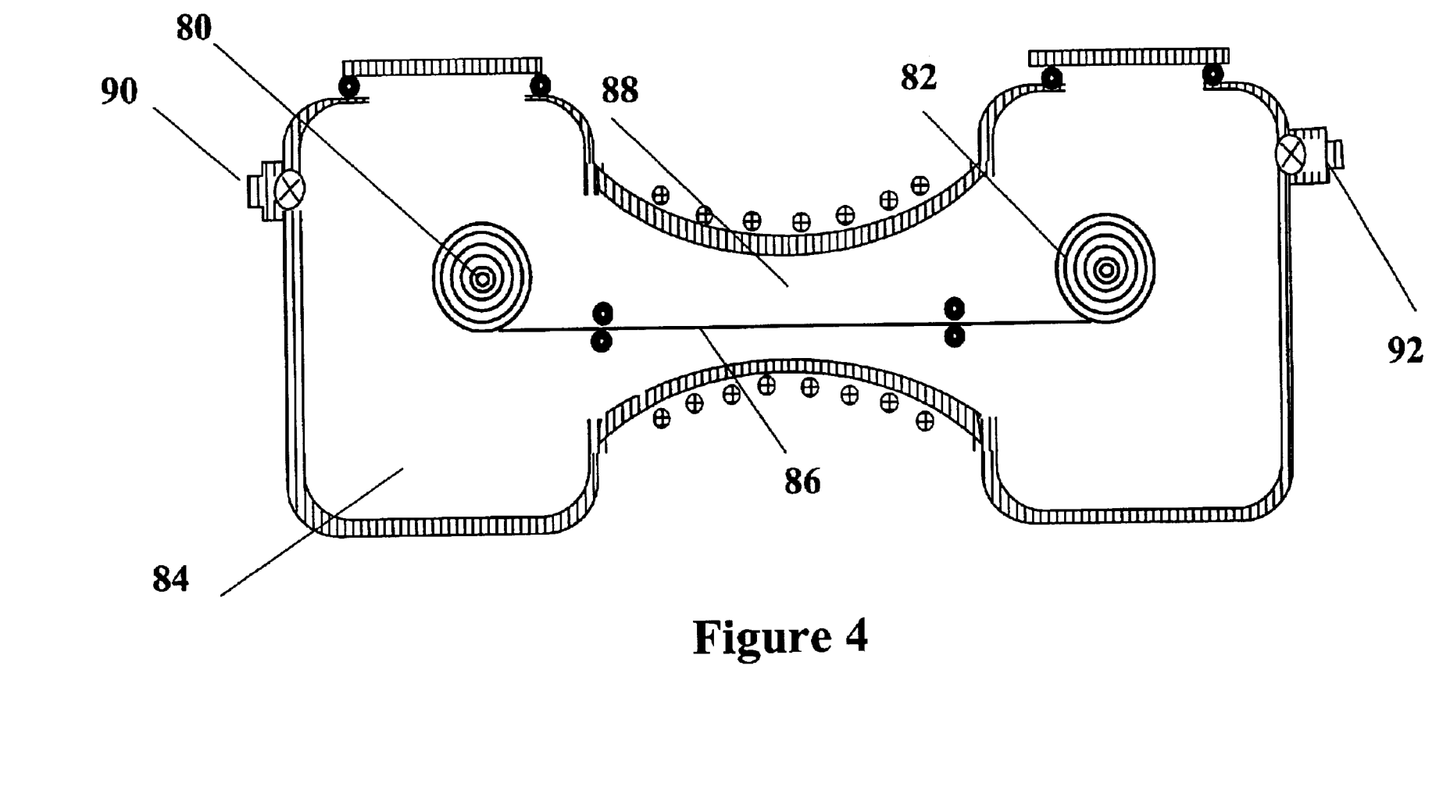
FIG. 4 is a schematic diagram of a sublimator system of the present invention illustrating a concentrated heating area for sublimation of a sublimatable solid precursor from a coated metallic substrate.

FIG. 4 illustrates another embodiment of the vaporize delivery system of the present invention wherein both the first 80 and second 82 rotatable spools are positioned within an internal chamber 84 and holding a metallic substrate coated with a sublimatable solid precursor 86 positioned therebetween. The coated substrate is moved through a concentrated heating area 88 that is heated to the sublimation temperature of the sublimatable solid precursor for vaporization therein. A carrier gas introduced in gas inlet port 90 is saturated with the vaporized precursor and removed from the heating area to a downstream processing chamber via gas outlet port 92.

Figure 5:
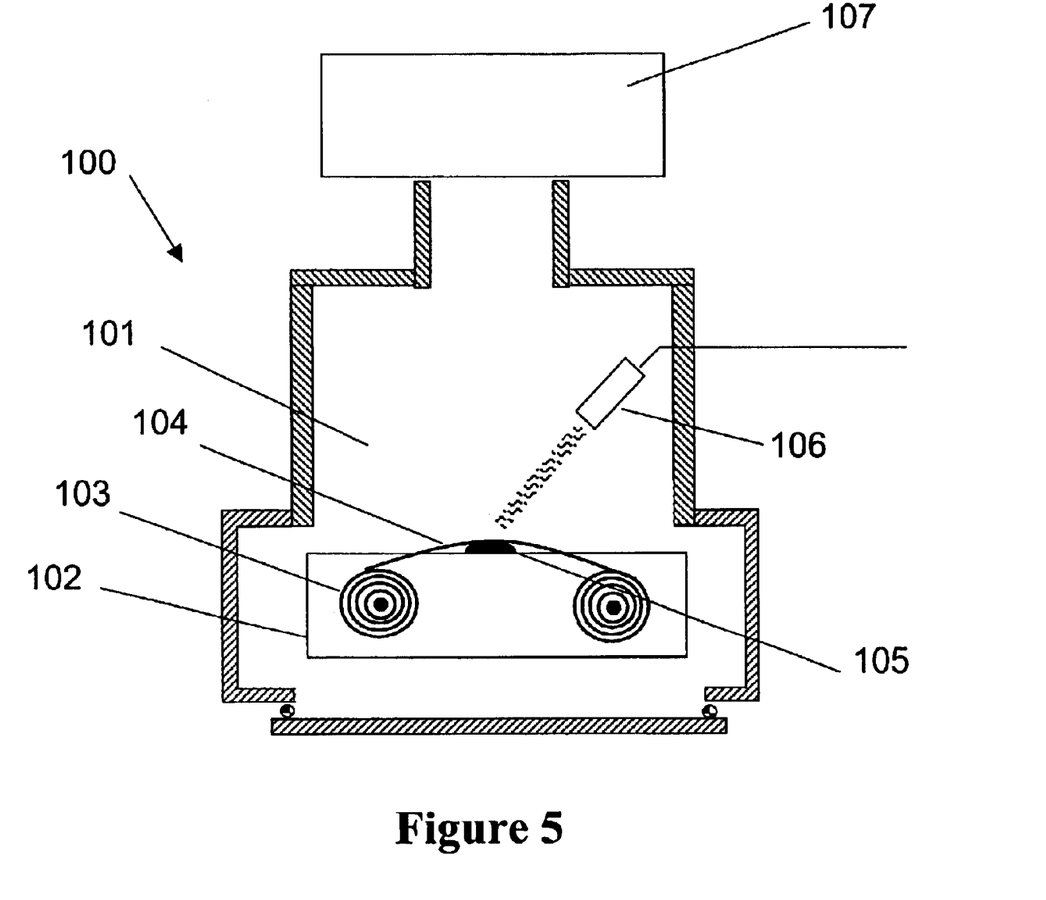
FIGS. 5 and 6 are schematic diagrams of sublimators of the present invention incorporating a containerize cassette including a coiled wire coated with a sublimatable solid and different heating devices that concentrate vaporization to a precise section of the coated substrate.

FIG. 5 illustrates yet another embodiment 100 of the present invention comprising a vaporization chamber 101 having positioned therein a containerized cassette 102 which includes rotatable spools for holding the metallic substrate coated with a sublimatable solid precursor 103. In this specific embodiment, the coated substrate 104 is continuously uncoiled from a first spool while only a select portion of the coated substrate is heated to a temperature sufficient to sublimate the sublimatable solid. Any heating device that can deliver and concentrate a source of energy that increases heat and/or electron vibrations in the sublimatable solid to cause vaporization is contemplated including, but limited to, electromagnetic radiation, such as frequencies in the infrared range, ultrasound, ultraviolet, electron gun, acoustic, optical heating devices. FIG. 5 shows an electromagnetic source 106 being administered to a small heating spot by 105 for more precise control of the vaporization process. Advantageously, the present invention including this embodiment eliminates the need for a carrier gas to transport the vaporized solid precursor material from the vaporization chamber to the processing tool 107 and refilling is merely a replacement of the used cassette.

Figure 6:
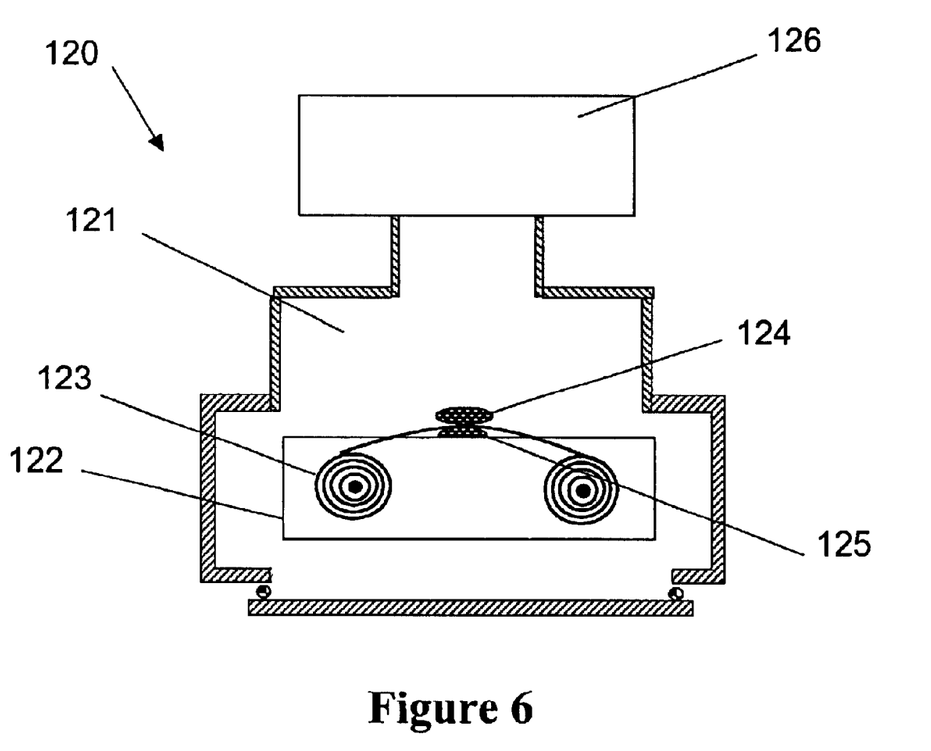

Likewise, the embodiment shown in FIG. 6 provides for similar advantages wherein the heating device is a heating head 124 and/or 125. The coated substrate is passed by heating heads 124 and/or 125 and subjected to a concentrated heating source that vaporizes the solid substrate for transference to the processing tool 126.

What is claimed is:

1. A vapor delivery system for vaporization and delivery of a precursor, comprising:
    a) a sealable housing comprising an internal chamber;
    b) a gas inlet port in fluid communication with the internal chamber for introducing a carrier gas;
    c) a first rotatable spool positioned adjacent to the housing;
    d) a wire coated with a sublimatable solid precursor material having one end connected to first rotatable spool and spooled thereon;
    e) a heating means communicatively connected to the internal chamber to heat at least a portion of the internal chamber thereby providing a heated area at the sublimation temperature of the sublimatable solid precursor material;
    f) at least one drive mechanism for unspooling and moving the coated wire through the heated area wherein the sublimatable solid precursor material is vaporized forming a precursor gas and a substantially uncoated wire; and
    g) a gas outlet port for passage of the precursor gas from the internal chamber to a downstream processing unit.

2. The vapor delivery system according to claim 1 further comprising a second rotatable spool for spooling of the uncoated wire, wherein the second rotatable spool is connected to the drive mechanism and positioned a distance from the first rotatable spool and adjacent to the housing.

3. The vapor delivery system according to claim 2, wherein the first and second rotatable spool are positioned on the longitudinal axis of the housing.

4. The vapor delivery system according to claim 1, wherein the sublimatable solid precursor is selected from the group consisting of: elemental boron, copper and phosphorus; decaborane; gallium halides, indium halides, antimony halides, arsenic halides, gallium halides, aluminum iodide, titanium iodide; cyclopentadienylcycloheptatrienyltitanium, ($C_p$TiCht); cyclooctatetraenecyclopentadienyltitanium; bis-cyclopentadienyltitaniumdiazide; In($CH_3$)$_2$(hfac); dibromomethylstibine; and tungsten carbonyl.

5. The vapor delivery system according to claim 1, wherein the sublimatable solid precursor is selected from the group consisting of: metalorganic β-diketonate complexes, metalorganic alkoxide complexes, metalorganic carboxylate complexes, metalorganic aryl complexes and metalorganic amido complexes.

6. The vapor delivery system according to claim 2, wherein the first and second rotatable spool are positioned outside of the housing.

7. The vapor delivery system according to claim 1, wherein the sealable housing is fabricated of a heat conducting material.

8. The vapor delivery system according to claim 1, wherein the first and second rotatable spool are connected to a drive mechanism.

9. The vapor delivery system according to claim 1, wherein the rotatable spool comprises multiple windings of the coated wire.

10. The vapor delivery system according to claim 1, wherein the coated wire is of a length greater than the longitudinal axis of the housing.

11. The vapor delivery system according to claim 2, further comprising at least two sealable air locks positioned on the longitudinal axis of the housing for moving of the coated wire from the first rotatable spool through the internal chamber to the second rotatable spool.

12. The vapor delivery system according to claim 2, further comprising a pair of electrodes positioned within the internal chamber on the longitudinal axis of the housing.

13. The vapor delivery system according to claim 12, wherein the coated wire comprise a core wire fabricated of an electrically conductive material.

14. The vapor delivery system according to claim 13, wherein the coated wire contacts the pair of electrodes.

15. A vaporizer delivery system, comprising:
   a) a sealable housing comprising an internal chamber;
   b) a gas inlet and gas outlet in fluid communication with the internal chamber;
   c) at least one rotatable spool positioned within the internal chamber for holding a wire coated with a sublimatable solid source material;
   d) a heating means communicatively connected to at least a portion of the housing to provide a heated area within the internal chamber at the sublimation temperature of the solid source material; and
   e) a drive mechanism for moving the coated wire from the rotatable spool through the heated area.

16. The vapor delivery system according to claim 15, further comprising a second rotatable spool for spooling of the uncoated wire, wherein the second rotatable spool is connected to the drive mechanism and positioned outside the internal chamber.

17. The vapor delivery system according to claim 16, wherein the first and second rotatable spool are positioned on the longitudinal axis of the housing.

18. The vapor delivery system according to claim 15, wherein the sublimatable solid precursor is selected from the group consisting of: elemental boron, copper and phosphorus; decaborane; gallium halides, indium halides, antimony halides, arsenic halides, gallium halides, aluminum iodide, titanium iodide; cyclopentadienylcycloheptatrienyltitanium, ($C_p$TiCht); cyclooctatetraenecyclopentadienyltitanium; biscyclopentadienyltitaniumdiazide; In($CH_3$)$_2$(hfac); dibromomethylstibine; and tungsten carbonyl.

19. The vapor delivery system according to claim 15, wherein the sublimatable solid precursor is selected from the group consisting of: metalorganic β-diketonate complexes, metalorganic alkoxide complexes, metalorganic carboxylate complexes, metalorganic aryl complexes and metalorganic amido complexes.

20. The vapor delivery system according to claim 15, wherein the sealable housing is fabricated of a heat conducting material.

21. The vapor delivery system according to claim 15, wherein the first and second rotatable spool are connected to a drive mechanism.

22. The vapor delivery system according to claim 15, wherein the first rotatable spool comprises multiple windings of the coated wire.

23. The vapor delivery system according to claim 15, wherein the coated wire is of a length greater than the longitudinal axis of the housing.

24. The vapor delivery system according to claim 15, further comprising a pair of electrodes positioned within the internal chamber on the longitudinal axis of the housing.

25. The vapor delivery system according to claim 24, wherein the coated wire comprises a core wire fabricated of an electrically conductive material.

26. The vapor delivery system according to claim 25, wherein the coated wire contacts the pair of electrodes.

27. The vapor delivery system according to claim 15, wherein the heating means heats a heating area without direct contact of the heating means to the coated substrate.

28. A vaporizer system comprising:
   a) a sealable vessel comprising an internal chamber;
   b) a gas inlet and gas outlet in fluid communication with the internal chamber;
   c) a conductive wire coated with a sublimatable solid source material for introduction into the internal chamber, wherein the conductive wire has a length extending beyond the longitudinal axis of the sealable vessel;
   d) at least one motorized mechanism positioned adjacent to the sealable vessel for moving the conductive wire through the internal chamber;
   e) a heating means for raising the temperature in the internal chamber to the sublimation temperature of the sublimatable solid source material; and
   f) a pair of electrodes positioned in the internal chamber and contacting the conductive wire for passing an electric heating current therethrough.

29. The vapor delivery system according to claim 28, wherein the conductive wire coated with a sublimatable solid source material is spooled on a first rotatable spool.

30. The vapor delivery system according to claim 28, wherein the sublimatable solid precursor is is selected from the group consisting of: elemental boron, copper and phosphorus; decaborane; gallium halides, indium halides, antimony halides, arsenic halides, gallium halides, aluminum iodide, titanium iodide; cyclopentadienylcycloheptatrienyltitanium, ($C_p$TiCht); cyclooctatetraenecyclopentadienyltitanium; biscyclopentadienyltitaniumdiazide; In($CH_3$)$_2$(hfac); dibromomethylstibine; and tungsten carbonyl.

31. The vapor delivery system according to claim 28, wherein the sublimatable solid precursor is selected from the group consisting of: metalorganic β-diketonate complexes, metalorganic alkoxide complexes, metalorganic carboxylate complexes, metalorganic aryl complexes and metalorganic amido complexes.

32. The vapor delivery system according to claim 28, wherein the sealable vessel is fabricated of a heat conducting material.

33. The vapor delivery system according to claim 28, wherein the heating means is selected from the group consisting of strip heaters, radiant heaters, circulating fluid heaters, resistant heating systems, and inductive heating systems.

34. A method for vaporizing and delivering a solid source material to a downstream semiconductor process chamber, comprising:
   a) providing a metallic substrate coated with a sublimatable solid precursor material;
   b) introducing the coated substrate into a housing having an internal chamber;
   c) heating the internal chamber to the sublimation temperature of the sublimatable solid precursor material to form a precursor gas; and
   d) moving the coated substrate through the internal chamber wherein the sublimatable solid material coated on the metallic substrate is sublimated to form a precursor gas and an uncoated metallic substrate; and
   e) removing the precursor gas from the internal chamber and transporting same to the downstream semiconductor process chamber.

35. The method according to claim 34, further comprising the step of passing an electric heating current through the coated substrate that has a core wire fabricated of an electrically conductive wire.

36. The method according to claim 34, wherein the coated substrate is wound on a rotatable spool positioned adjacent to the housing.

37. The method according to claim 36, wherein the moving of the coated substrate through the internal chamber is moved by a drive mechanism connected to the rotatable spool.

38. The method according to claim 34, wherein the sublimatable solid precursor is selected from the group consisting of: elemental boron, copper and phosphorus; decaborane; gallium halides, indium halides, antimony halides, arsenic halides, gallium halides, aluminum iodide, titanium iodide; cyclopentadienylcycloheptatrienyltitanium, ($C_p$TiCht); cyclooctatetraenecyclopentadienyltitanium; bis-cyclopentadienyltitaniumdiazide; In($CH_3$)$_2$(hfac); dibromomethylstibine; and tungsten carbonyl.

39. The vapor delivery system according to claim 34, wherein the sublimatable solid precursor is selected from the group consisting of: metalorganic β-diketonate complexes, metalorganic alkoxide complexes, metalorganic carboxylate complexes, metalorganic aryl complexes and metalorganic amido complexes.

40. The method according to claim 36, wherein the rotatable spool comprises multiple windings of the coated substrate.

41. The method according to claim 34, wherein the heating of the internal chamber is conducted by a heating selected from the group consisting of strip heaters, radiant heaters, circulating fluid heaters, resistant heating systems, and inductive heating systems.

42. The method according to claim 34, further comprising moving the uncoated substrate from the internal chamber.

43. A system for delivering a precursor vapor, said system comprising:

a) a solid precursor vaporization chamber;

b) an elongate support having a vaporizable solid precursor coated thereon;

c) means for (i) translating the elongate support having the vaporizable solid precursor coated thereon through the chamber so that a length of the elongate support having the vaporizable solid precursor coated thereon is exposed for vaporization of said vaporizable solid precursor in said chamber, and (ii) translating out of the chamber the elongate support from which the solid precursor has been vaporized; and d) means for heating the exposed length of the elongate support having the vaporizable solid precursor coated thereon in said chamber.

44. The system of claim 43, wherein the support comprises an electrically resistively heatable element, and said heating means comprise means for electrifying said electrically resistively heatable element to a temperature for vaporizing said solid precursor coated on the elongate support.

45. The system of claim 43, wherein the support comprises a structure selected from the group consisting of screens, meshes, webs, wires, fibers, multifilament ropes, chain structures, and ribbons.

46. The system of claim 43, wherein the support comprises a wire element.

47. The system of claim 46, wherein the means for (i) translating the elongate support having the vaporizable solid precursor coated thereon through the chamber so that a length of the elongate support having the vaporizable solid precursor coated thereon is exposed for vaporization of said vaporizable solid precursor in said chamber, and (ii) translating out of the chamber the elongate support from which the solid precursor has been vaporized, comprise dispensing and uptake spools of said wire element arranged for continuous feed of the wire element through said chamber, whereby the dispensing spool of said wire element supplies wire element coated with said vaporizable solid precursor to said chamber in a continuous manner.

48. The system of claim 46, wherein the dispensing spool is containerized in a cassette.

49. The system of claim 43, wherein the solid precursor vaporization chamber is maintained under a vacuum.

* * * * *